United States Patent
Katayama et al.

(10) Patent No.: US 10,600,720 B2
(45) Date of Patent: Mar. 24, 2020

(54) SEMICONDUCTOR DEVICE

(71) Applicant: TOYOTA JIDOSHA KABUSHIKI KAISHA, Toyota-shi, Aichi-ken (JP)

(72) Inventors: Yukihisa Katayama, Nagoya (JP); Ryo Yokozawa, Nisshin (JP); Naoyuki Takahashi, Toyoake (JP)

(73) Assignee: TOYOTA JIDOSHA KABUSHIKI KAISHA, Toyota-shi, Aichi (JP)

( * ) Notice: Subject to any disclaimer, the term of this patent is extended or adjusted under 35 U.S.C. 154(b) by 0 days.

(21) Appl. No.: 16/113,431

(22) Filed: Aug. 27, 2018

(65) Prior Publication Data

US 2019/0096784 A1   Mar. 28, 2019

(30) Foreign Application Priority Data

Sep. 26, 2017   (JP) ................... 2017-185098

(51) Int. Cl.
| | | |
|---|---|---|
| H01L 23/373 | (2006.01) | |
| H01L 23/473 | (2006.01) | |
| F28F 21/06 | (2006.01) | |
| H01L 23/367 | (2006.01) | |
| F28D 1/03 | (2006.01) | |
| H01L 23/31 | (2006.01) | |
| F28F 3/02 | (2006.01) | |

(Continued)

(52) U.S. Cl.
CPC ........ *H01L 23/3737* (2013.01); *F28D 1/0366* (2013.01); *F28F 3/02* (2013.01); *F28F 21/065* (2013.01); *H01L 23/051* (2013.01); *H01L 23/31* (2013.01); *H01L 23/3672* (2013.01); *H01L 23/44* (2013.01); *H01L 23/473* (2013.01); *F28D 2021/0029* (2013.01); *F28F 3/022* (2013.01); *F28F 2255/06* (2013.01); *H01L 23/3107* (2013.01); *H01L 23/373* (2013.01)

(58) Field of Classification Search
CPC ....... H01L 23/42–4338; H01L 23/3737; H01L 23/473; H01L 23/3672
See application file for complete search history.

(56) References Cited

U.S. PATENT DOCUMENTS

| | | | |
|---|---|---|---|
| 2006/0096299 A1* | 5/2006 | Mamitsu | H01L 23/473 62/3.2 |
| 2016/0247743 A1* | 8/2016 | Kadoguchi | H01L 23/293 |
| 2017/0309542 A1* | 10/2017 | Aramaki | B81B 3/0081 |

FOREIGN PATENT DOCUMENTS

| | | |
|---|---|---|
| JP | 2016-092266 A | 5/2016 |
| JP | 2016-111089 A | 6/2016 |
| JP | 2016-131196 A | 7/2016 |

* cited by examiner

*Primary Examiner* — Dale E Page
*Assistant Examiner* — Wilner Jean Baptiste
(74) *Attorney, Agent, or Firm* — Sughrue Mion, PLLC

(57) ABSTRACT

A semiconductor device may include: a semiconductor module in which a semiconductor element is sealed in a resin package, and a heat sink is located on at least one surface of the resin package; an insulating sheet covering the heat sink; a cooling plate which is constituted of resin containing heat transfer fillers, the cooling plate having one surface and another surface, wherein the one surface covers the insulating sheet and is bonded to the at least one surface of the resin package, the other surface is provided with fins; and a cooler constituted of resin and configured to flow coolant along the fins, wherein the cooler surrounds the cooling plate in a view along a normal direction of the cooling plate, and is bonded to both ends of the resin package in the view along the normal direction.

3 Claims, 5 Drawing Sheets

(51) Int. Cl.
*H01L 23/44* (2006.01)
*H01L 23/051* (2006.01)
*F28D 21/00* (2006.01)

SEMICONDUCTOR DEVICE

CROSS-REFERENCE

This application claims priority to Japanese patent application No. 2017-185098, filed on Sep. 26, 2017, contents of which are incorporated herein by reference.

TECHNICAL FIELD

The technique disclosed herein relates to a semiconductor device including integrated resin cooler and semiconductor module in which a semiconductor element is sealed in a resin package.

BACKGROUND

JP 2016-131196A describes a semiconductor device having integrated resin cooler and semiconductor module provided with a resin package in which a semiconductor element is sealed. The resin package of the semiconductor module is flat, and a heat sink is exposed over its wide-width surface. The heat sink is covered by an insulating sheet, and a cooling plate is bonded to the wide-width surface of the resin package with this insulating sheet in between them. Fins are provided on an opposite side from the insulating sheet of the cooling plate. The resin cooler surrounds the cooling plate in a view along a normal direction of the cooling plate, and is bonded to both ends of the resin package in the view along the normal direction. Passages are provided inside the cooler and on both sides of the resin package in the view along the normal direction, and coolant is configured to flow along the fins of the cooler through these passages. The cooler is bonded to the both ends of the resin package and covers both sides of the cooling plate by interposing the cooling plate between itself and the resin package.

In the semiconductor device described in JP 2016-131196A, the cooling plate is constituted of metal with high heat transfer performance, such as aluminum or copper. The metal such as aluminum has quite different linear expansion coefficients from those of resin. Due to this difference in the linear expansion coefficients, stress is generated in the insulating sheet between the cooling plate and the cooler, and an edge of the cooling plate may be detached from the insulating sheet and cooling performance may thereby deteriorate. In the semiconductor device of JP 2016-131196A, the resin cooler covers the both sides of the cooling plate by interposing the cooling plate between itself and the resin package, by which detachment of the cooling plate is prevented.

SUMMARY

The disclosure herein provides a technique that suppresses chronological deterioration of cooling performance by an approach different from that of the technique of JP 2016-131196 A.

A semiconductor device disclosed herein may comprise a semiconductor module, an insulating sheet, a cooling plate, and a cooler. In the semiconductor module, a semiconductor element may be sealed in a resin package, and a heat sink may be located on at least one surface of the resin package. The insulating sheet may cover the heat sink. The cooling plate may have one surface and another surface, in which the one surface may cover the insulating sheet and may be bonded to the at least one surface (e.g., the surface over which the heat sink is exposed) of the resin package, and the other surface may be provided with fins. The cooling plate may be constituted of resin containing heat transfer fillers. The cooler may be configured to flow coolant along the fins, in which the cooler may surround the cooling plate in a view along a normal direction of the cooling plate, and may be bonded to both ends of the resin package in the view along the normal direction.

Details and further improvements of the technique disclosed herein will be described in the Detailed Description below.

DETAILED DESCRIPTION

Figure 1:
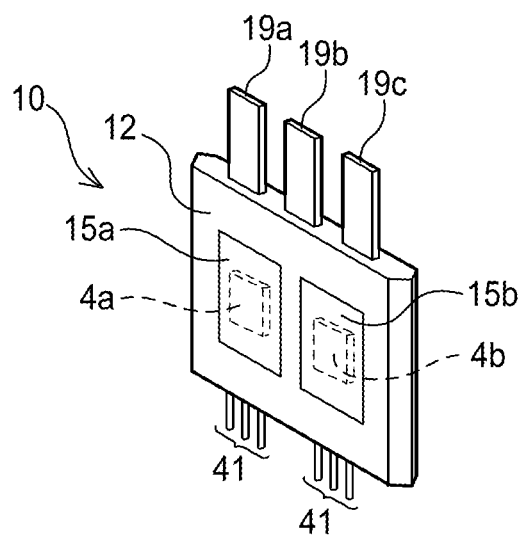
FIG. 1 is a perspective view of a semiconductor module.
Figure 1:
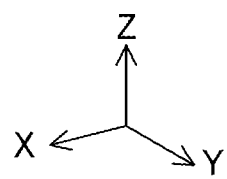

In an embodiment of the technique disclosed herein, a semiconductor device may comprise a semiconductor module, an insulating sheet, a cooling plate, and a cooler. In the semiconductor module, a semiconductor element may be sealed in a resin package, and a heat sink may be located on at least one surface of the resin package. The insulating sheet may cover the heat sink. The cooling plate may have one surface and another surface, in which the one surface may cover the insulating sheet and may be bonded to the at least one surface (e.g., the surface over which the heat sink is exposed) of the resin package, and the other surface may be provided with fins. The cooling plate may be constituted of resin containing heat transfer fillers. The cooler may be configured to flow coolant along the fins, in which the cooler may surround the cooling plate in a view along a normal direction of the cooling plate, and may be bonded to both ends of the resin package in the view along the normal direction.

In the semiconductor device disclosed herein, the cooling plate is constituted of resin instead of metal. Due to this, a difference in linear expansion coefficients from the resin package is not as large as in a case of metal cooling plate. Further, since both the cooling plate and the resin package are constituted of resin, bonding performance between them is excellent. Due to this, the cooling plate is less prone to being detached from the resin package. As a result, chronological deterioration of cooling performance becomes small.

In an embodiment of the technique disclosed herein, an edge around a cooling plate may be separated from a cooler in a view along a normal direction of the cooling plate. When an end of the cooling plate is in contact with the cooler, stress may be generated in the cooling plate due to interference between the cooler and the cooling plate caused by heat applied in a manufacturing process of the cooler or heat during an operation of a semiconductor device. In the above structure, since the cooling plate is separated from the cooler, the end of the cooling plate is not interfered by the cooler, and the stress by such interference may not be generated.

In an embodiment of the technique disclosed herein, the heat transfer fillers may have an elongated shape, and the heat transfer fillers in each of the fins may be oriented with their longitudinal direction in a direction from a base toward a tip of the fin. Since the heat transfer fillers having the elongated shape are oriented in the direction from the base toward the tip of the fin, the heat of the cooling plate is efficiently transferred to the tip of the fin.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

A semiconductor device of an embodiment will be described with reference to the drawings. A semiconductor device 2 is a device in which a plurality of semiconductor modules 10 and a cooler are integrated. Firstly, an overview of the semiconductor modules 10 will be described with reference to FIG. 1.

FIG. 1 is a perspective of a semiconductor module 10. The semiconductor module 10 is a device in which two semiconductor elements 4a, 4b are embedded inside a flat resin package 12. Each of the semiconductor elements 4a, 4b is for example a chip in which an insulated gate-type bipolar transistor (so-called IGBT) and a diode are connected in inverse parallel. The two semiconductor elements 4a, 4b inside the package 12 are connected in series. A series connection of two IGBTs configures an upper arm switching element and a lower arm switching element in one phase of an inverter, for example. Three power terminals extend from one narrow-width surface (being an upper surface in FIG. 1) of the flat package 12, and a plurality of control terminals 41 extends from a narrow-width surface on an opposite side. The power terminals 19a, 19b, 19c are respectively connected to a midpoint, a high potential end, and a low potential end of the series connection of the two semiconductor elements 4a, 4b. Heat sinks 15a, 15b are exposed on one wide-width surface of the flat package 12. The heat sink 15a is electrically and thermally connected to the semiconductor element 4a within the package 12, and the heat sink 15b is electrically and thermally connected to the semiconductor element 4b within the package 12. Another heat sink (heat sink 13 to be described later) is exposed on a wide-width surface on an opposite side from the heat sinks 15a, 15b. The heat sink 13 serves as a conductor that connects the semiconductor elements 4a, 4b in series, and is electrically and thermally connected to the semiconductor elements 4a, 4b. The heat sinks 13, 15a, 15b are constituted of copper having high thermal transfer performance and low electric resistance.

Figure 2:
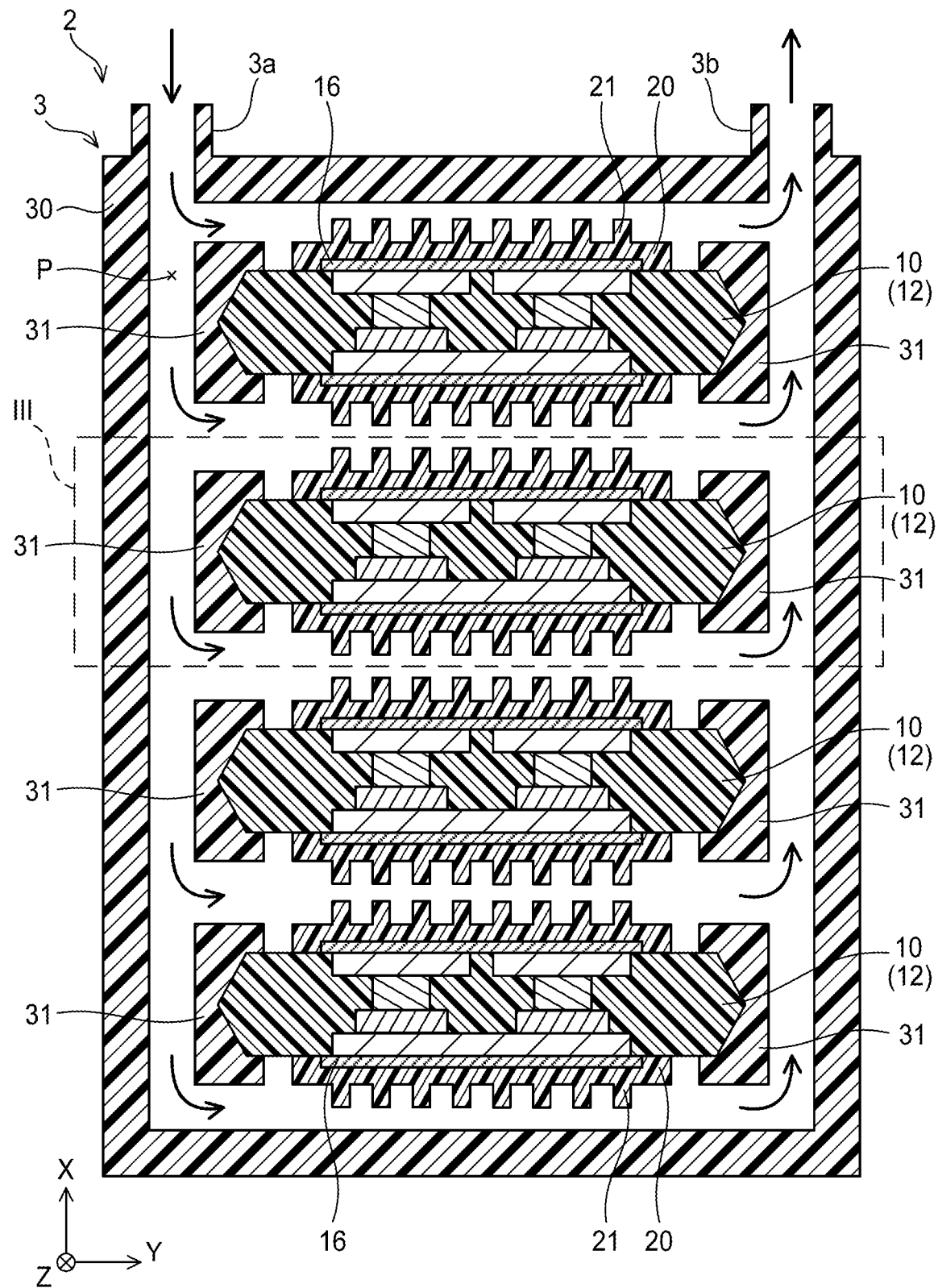
FIG. 2 is a cross-sectional view of a semiconductor device of an embodiment.

FIG. 2 shows a cross-sectional view of the semiconductor device 2. An overview of the semiconductor device 2 will be described with reference to FIG. 2. Details of the semiconductor device 2 will be described later with reference to FIGS. 3 to 5.

The cooler 3 is a square cylinder constituted of resin, inside of which is a passage P through which coolant passes. The cooler 3 includes a square-cylindrical outer cylinder 30 and a plurality of beams 31 bridged inside the outer cylinder 30. The plurality of semiconductor modules 10 is fixed inside the cylindrical cooler 3. The plurality of semiconductor modules 10 is arranged with intervals between each other in a cylinder axis direction of the cylindrical cooler 3 (X direction in a coordinate system in the drawing). The flat semiconductor modules 10 each have their narrow-width four surfaces bonded to the inner side of the cylindrical cooler 3. In other words, the flat semiconductor modules 10 have their circumference bonded to the inner side of the cylindrical cooler 3 as seen in a view along a normal direction of their wide-width surfaces. Both ends in a Y direction of each semiconductor module 10 in the coordinate system in the drawing are bonded to its corresponding beams 31. Although it will be described later, both ends in a Z direction are bonded to the inner sides of the outer cylinder 30.

A cooling plate 20 is attached to each wide-width surface of the package 12 of each semiconductor module 10 with an insulating sheet 16 interposed therebetween. A plurality of pin fins 21 is provided on a side of each cooling plate 20 facing the passage P. In FIG. 2, reference signs are given to the insulating sheets, the cooling plates, and the fins at an uppermost end and a lowermost end, and the reference signs are omitted for other insulating sheet, cooling plates, and fins.

The cooler 3 is provided with a coolant supply inlet 3a and a coolant discharge outlet 3b. Arrow lines in FIG. 2 show flow of the coolant. The coolant is fluid, and is typically water or LLC (Long Life Coolant). The coolant having flown in from the coolant supply inlet 3a flows through between the pin fins 21 of the cooling plates 20 by passing through the passage P, and absorbs heat from the semiconductor modules 10. The coolant that had absorbed heat is discharged from the coolant discharge outlet 3b. The cooling plates 20 with the fins are attached to both of the wide-width surfaces of each flat package 12, and since the coolant passes through between those pin fins 21, the semiconductor device 2 has a high cooling efficiency of the semiconductor modules 10.

Figure 3:
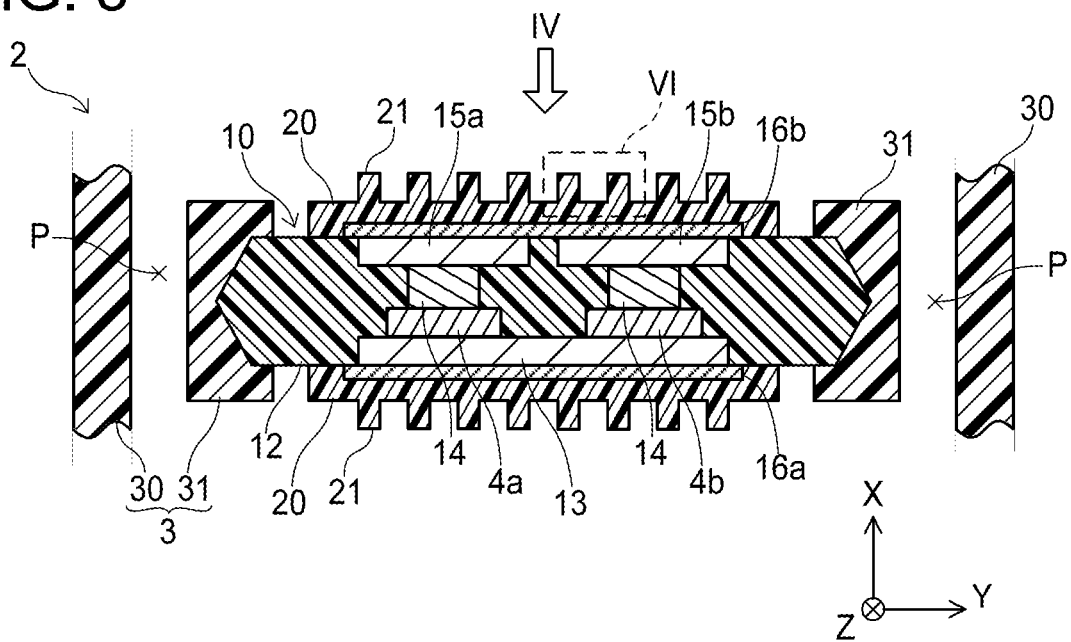
FIG. 3 is a partial cross-sectional view of a range indicated by a broken line III in FIG. 2.
Figure 4:
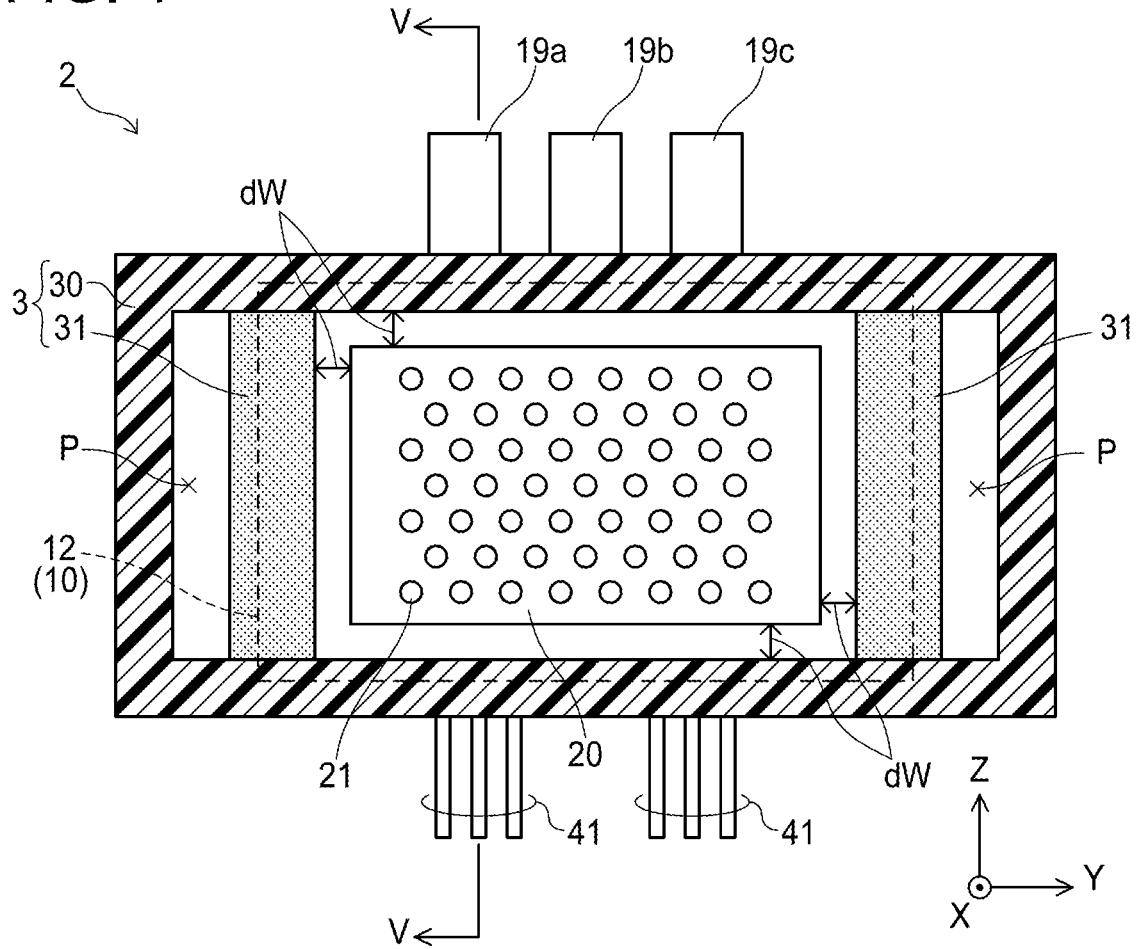
FIG. 4 is a diagram seen along a direction of an arrow IV of FIG. 3.
Figure 5:
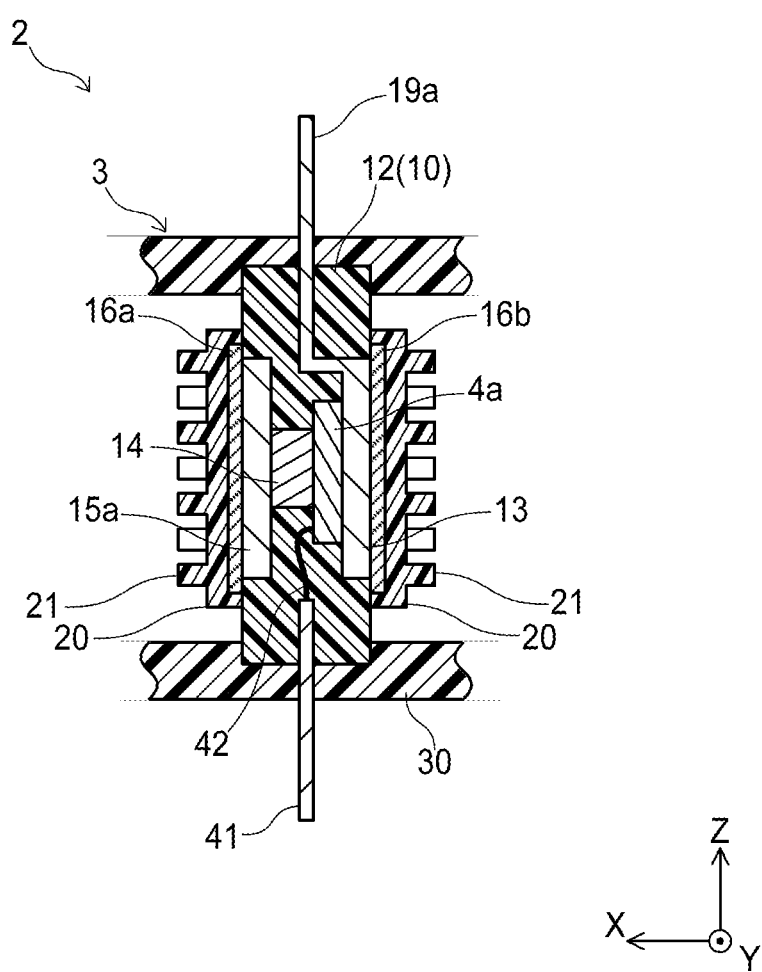
FIG. 5 is a cross-sectional view along a line V-V in FIG. 4.

A structure of the semiconductor device 2 will be described with reference to FIGS. 3 to 5. FIG. 3 shows a partial cross-sectional view extracting a range of a broken line III in FIG. 2, and FIG. 4 shows the semiconductor device 2 as seen along a direction of an arrow IV in FIG. 3. FIG. 5 shows a cross-sectional view along a line V-V in FIG. 4. In FIGS. 3 to 5, an aspect ratio of some components of the semiconductor module 10 is depicted with deformation for the sake of easier understanding.

As aforementioned, each semiconductor module 10 is a device that sealed the two semiconductor elements 4a, 4b within the resin package 12. A resin material in which a nonorganic substance is mixed with thermal curing resin such as epoxy resin is used as a material of the package 12. The semiconductor elements 4a, 4b are also flat, and they each have a plate-like collector electrode provided on one wide-width surface and a plate-like emitter electrode and control electrodes provided on the other wide-width surface. The control electrodes are a gate electrode and terminals for a temperature sensor incorporated in the semiconductor element 4a, 4b.

The heat sink 13 is exposed on the one wide-width surface of the flat package 12, and the heat sinks 15a, 15b are exposed on the other wide-width surface thereof. The emitter electrode of the semiconductor element 4a and the collector electrode of the semiconductor element 4b are bonded to a back side of the heat sink 13 (side embedded within the package 12). That is, the heat sink 13 serves a role of a connecting conductor that connects the semiconductor elements 4a, 4b in series connection. The collector electrode of the semiconductor element 4a is connected to the heat sink 15a via a copper spacer 14. The emitter electrode of the semiconductor element 4b is connected to the heat sink 15b via a copper spacer 14. Solder is used to bond the semiconductor elements 4a, 4b to the heat sinks 13, 15a, 15b and to the spacers 14.

As shown in FIG. 5, the heat sink 13 and the power terminal 19a are continuous within the package 12. That is, the midpoint of the series connection of the two semiconductor elements 4a, 4b is connected to the power terminal 19a via the heat sink 13. Although depiction in the drawing is omitted, similarly, the high potential side of the series connection of the two semiconductor elements 4a, 4b is connected to the power terminal 19b via the heat sink 15a, and the low potential side thereof is connected to the power terminal 19c via the heat sink 15b. As above, the heat sinks 13, 15a, 15b are electrically connected to the electrodes of the semiconductor elements 4a, 4b, and the heat inside the semiconductor elements 4a, 4b are transferred to the heat sinks 13, 15a, 15b efficiently through the electrodes. The control electrodes of the semiconductor element 4a and the control terminals 41 are connected within the package 12 by bonding wires 42. Similarly, the control electrodes of the semiconductor element 4b are connected to control terminals by bonding wires.

The insulating sheet 16a is adhered to one of the wide-width surfaces of the package 12 so as to cover the heat sinks 15a, 15b. On the other one of the wide-width surfaces, the insulating sheet 16b is adhered so as to cover the heat sink 13. The insulating sheets 16a, 16b are fabricated by a material which uses epoxy resin as a base and containing boron nitride and alumina. The insulating sheet 16a is in a liquid form upon fabrication, and is applied to the wide-width surface so as to cover the heat sinks 15a, 15b. The liquid insulating material is hardened and becomes the insulating sheet 16a. The same applies to the insulating sheet 16b. Hereinbelow, the insulating sheets 16a, 16b will be denoted insulating sheets 16 when a distinction between them is not necessary.

The cooling plate 20 is bonded to each wide-width surface of the package 12. Each cooling plate 20 covers the insulating sheet 16 and is bonded to the wide-width surface of the package 12 at a periphery of the insulating sheet 16. The cooling plates 20 are fabricated with resin containing heat transfer fillers. Resin that is to be a base thereof is for example epoxy resin. The heat transfer fillers to be mixed into epoxy resin may for example be flaky graphite, graphene, high-thermal conductive carbon fiber and the like. An atmospheric pressure plasma bonding method is used for bonding the cooling plates 20 and the packages 12. For the bonding of the cooling plates 20 and the packages 12, an interface bonding method using an interface treatment agent containing amine, thiol, silicon as its functional group may be employed.

The plurality of pin fins 21 is provided on each cooling plate 20 on the opposite side from the surface that is bonded with tis corresponding package 12. The cooling plates 20 and their pin fins 21 are molded by inputting a package 12 to which the insulating sheets 16 are adhered into a mold, and injecting a resin composite containing the heat transfer filler to a cavity of this mold. An injection molding pressure for this occasion may be adjusted for example to less than 10 (MPa) so that the package 12 is not damaged. Further, a mold temperature may be less than 210° C. The cooling plates 20 provided with the pin fins 21 are molded by methods such as transfer molding, injection molding, compression molding, and the like.

Figure 6:
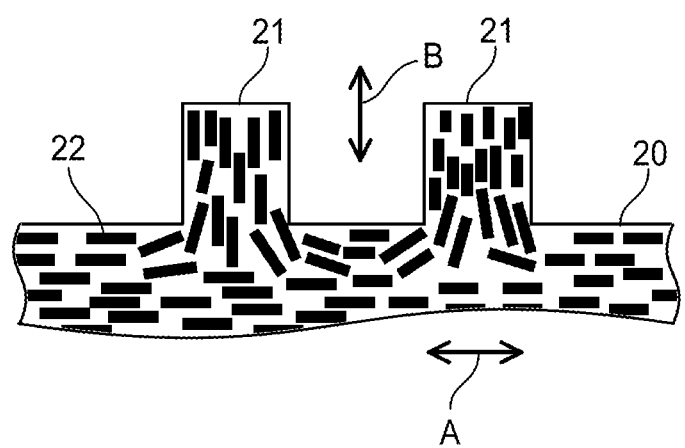
FIG. 6 is an enlarged view of a range indicated by a broken line VI in FIG. 3.

Here, an orientation of the heat transfer fillers contained in the cooling plates 20 will be described. FIG. 6 shows an enlarged view of a range of a broken line VI of FIG. 3. In FIG. 6, the heat transfer fillers 22 contained in the resin base are indicated by black bold lines. The heat transfer fillers 22 are elongated needle shaped. The heat transfer fillers 22 are oriented along a direction parallel to a plate surface of the cooling plate 20 inside a plate portion of the cooling plate 20 (direction of an arrow A in the drawing). Inside each pin fin 21, the heat transfer fillers 22 are oriented along a direction from a base to a tip of the pin fin 21 (direction of an arrow B in the drawing). The cooling plate 20 exhibits high heat transfer performance in the orientation direction of the heat transfer fillers 22. The heat transfer fillers 22 are oriented in a spreading direction of the plate surface inside the plate portion of the cooling plate 20, and are oriented in the direction from the base toward the tip in the pin fin 21 inside the pin fins 21. These orientations allow the heat in the plate portion of the cooling plate 20 to transfer easily toward the tip of the pin fin 21.

Returning to FIGS. 3 to 5, the cooler 3 will be described. As described above, the cooler 3 includes the square cylindrical outer cylinder 30 and the plurality of beams 31 provided inside the outer cylinder 30. In FIG. 4, the beams 31 are indicated in gray for easier understanding. A pair of beams 31 corresponds to each semiconductor module 10. As shown in FIGS. 3 and 4, each pair of beams 31 have both ends bonded to inner surfaces of the square cylindrical outer cylinder 30. One semiconductor module 10 is arranged between the beams 31 of each pair. The both ends of the flat semiconductor module 10 (package 12) in the Y direction of the coordinate system in the drawings are bonded to the beams 31, and the both ends in the Z direction are bonded to the inner surfaces of the outer cylinder 30. The periphery of the package 12 is bonded to the cooler 3 as seen in the view along the normal direction of the wide-width surfaces of the package 12, and the power terminals 19a, 19b, 19c and the control terminals 41 penetrate the outer cylinder 30 and extend to outside the outer cylinder 30.

The cooler 3 is composed of resin. The material of the cooler 3 is for example epoxy-based resin. The outer cylinder 30 is divided into a plurality of cylinder blocks in the X direction of the coordinate system in the drawings, and adjacent cylinder blocks are bonded with a gasket (not shown) for preventing liquid leak in between them. In the drawings, the plural blocks are depicted as one outer cylinder 30. The outer cylinder 30 is divided into a same number of blocks as the semiconductor modules 10. Further, one block is defined for each semiconductor module 10. Each block of the cooler 3 is fabricated by inputting the semiconductor module 10 having the cooling plates 20 thereon in a mold and injecting molten resin.

In the mold for fabricating the cooler 3, the cooling plates 20 are separated from a cavity for forming the cooler 3 by a floating type mold. As a result, as shown in FIG. 4, a space with a distance dW is ensured between the periphery of the cooling plate 20 and inner surfaces of the cooler 3 as seen along the normal direction of the cooling plate 20. In other words, when seen along the normal direction of the cooling plate 20, edges defining the periphery of the cooling plate 20 are separated from the inner surfaces of the cooler 3 by the distance dW. The cooling plate 20 does not necessarily need to be completely separated from the cavity. In other words, the cooling plate 20 may have a part thereof contacting the cooler 3.

Conditions for fabricating the cooler 3 is arbitrary, however, the mold temperature may be suppressed to be equal to or lower than 210° C. In hardening the molten resin in the mold, heat treatment may be performed at 180° C. or higher for 3 hours or more to bring resin crosslinking density close to 100%. By performing such a process and with the cooling plate 20 being separated from the cooler 3, internal stress generated in the cooling plate 20 can be suppressed low despite thermal contraction that occurs upon fabricating the cooler 3.

Spaces between the beams 31 and the outer cylinder 30 in the Y direction of the drawings correspond to the passage P. As described above with reference to FIG. 2, the coolant supplied from outside the cooler 3 flows through between the pin fins 21 of the cooling plates 20 through the passage P, and is discharged to outside the cooler 3 through the passage P.

Advantages of the semiconductor device 2 will be described. In the semiconductor device 2, resin containing the heat transfer fillers is employed instead of metal as the material of the cooling plates 20 for bonding to the packages 12 of the semiconductor modules 10. Since the packages 12 of the semiconductor modules 10 are also fabricated of resin, bonding performance between the resin cooling plates 20 and the packages 12 is excellent. Further, as compared to metal cooling plates, the resin cooling plates 20 have a smaller difference in linear expansion coefficients from the packages 12. Due to this, the stress generated at bonded portions of the cooling plates 20 and the packages 12 by the heat upon fabricating the cooling plates 20, the heat upon fabricating the cooler 3, and heat cycles during operation of the semiconductor device 2 is small. Due to this, the cooling plates 20 are resistant against detachment from the packages 12, and chronological deterioration of cooling performance is small.

As seen along the normal direction of the cooling plates 20 (X direction in the drawings), the edges defining the periphery of each cooling plate 20 is separated from the cooler 3. Due to this feature, the thermal stress is not generated in the cooling plates 20 by the heat upon fabricating the cooler 3. This also contributes to the resistance of the cooling plates 20 against detachment.

The cooling plates 20 are fabricated by resin containing the elongated-shape heat transfer fillers. The heat transfer fillers are oriented in the direction from the base toward the tip of the pin fin 21 inside each pin fin 21. This orientation allows the heat in the cooling plates 20 to efficiently transfer to the tips of the pin fins 21.

Some features related to the technique described in the embodiment will be noted. The cooling plates 20 are provided with the pin fins 21. They may be plate-like fins instead of the pin fins. In the semiconductor device 2 of the embodiment, an entirety of the periphery of each package 12 is bonded to the cooler 3 as seen in the view along the normal direction of the wide-width surfaces of the semiconductor modules 10. The package 12 simply needs to be bonded to the cooler with at least a pair of ends as seen in the view along the normal direction.

The semiconductor element sealed in each semiconductor module 10 may be one, or three or more. In the semiconductor device 2 of the embodiment, the heat sinks are exposed on each of the pair of wide-width surfaces of each semiconductor module 10, and the cooling plates 20 are bonded thereto. The heat sink simply needs to be exposed on at least one surface of the semiconductor module, and the cooling plate simply needs to be bonded hereto. There is no limit to a number of semiconductor modules accommodated in the cooler 3.

What is claimed is:

1. A semiconductor device comprising:
   a semiconductor module comprising a semiconductor element, a resin package sealing the semiconductor element, and a heat sink located at a main surface of the resin package, the resin package comprising a pair of side surfaces each adjacent to the main surface and opposite to each other;
   an insulating sheet covering the heat sink;
   a cooling plate which is constituted of resin containing heat transfer fillers, the cooling plate having a first surface and a second surface opposite from the first surface, wherein the first surface covers the insulating sheet and is in direct contact with the main surface of the resin package around the insulating sheet, and the second surface is provided with fins; and
   a cooler constituted of resin and at least partly defining a coolant passage configured to flow coolant along the fins, wherein the cooler surrounds the cooling plate in a view along a normal direction of the cooling plate, and is in direct contact with each of the pair of side surfaces of the resin package,
   wherein
   a peripheral edge of the cooling plate is separated from the cooler by a gap;
   the gap extends from the coolant passage to the main surface of the resin package such that the coolant passage is partly defined by the main surface of the resin package;
   the cooler directly contacts the main surface of the resin package around the peripheral edge of the cooling plate; and
   the cooler comprises an outer cylinder at least partly defining the coolant passage and at least two beams provided in the outer cylinder and being in direct contact with the pair of side surfaces and the main surface of the resin package.

2. The semiconductor device according to claim 1, wherein
   the heat transfer fillers have an elongated shape, and
   the heat transfer fillers in each of the fins are oriented with their longitudinal direction in a direction from a base toward a tip of the fin.

3. A semiconductor device comprising:
   a semiconductor module comprising a semiconductor element, a resin package sealing the semiconductor element, and a heat sink located at a main surface of the resin package, the resin package comprising a pair of side surfaces each adjacent to the main surface and opposite to each other;

an insulating sheet covering the heat sink;

a cooling plate which is constituted of resin containing heat transfer fillers, the cooling plate having a first surface and a second surface opposite from the first surface, wherein the first surface covers the insulating sheet and is in direct contact with the main surface of the resin package around the insulating sheet and the second surface is provided with fins; and a cooler constituted of resin and at least partly defining a coolant passage configured to flow coolant along the fins, wherein the cooler surrounds the cooling plate in a view along a normal direction of the cooling plate, and is in direct contact with the pair of side surfaces of the resin package, wherein the cooler comprises an outer cylinder at least partly defining the coolant passage and at least two beams provided in the outer cylinder and being in direct contact with the pair of side surfaces and the main surface of the resin package.

\* \* \* \* \*